United States Patent
Zhu et al.

(10) Patent No.: US 8,307,269 B2
(45) Date of Patent: Nov. 6, 2012

(54) SCALABLE FOLDED DECODER ARCHITECTURE FOR LOW DENSITY PARITY CHECK CODES

(75) Inventors: Yuming Zhu, Plano, TX (US); Manish Goel, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 486 days.

(21) Appl. No.: 12/631,455

(22) Filed: Dec. 4, 2009

(65) Prior Publication Data

US 2010/0115386 A1     May 6, 2010

Related U.S. Application Data

(63) Continuation-in-part of application No. 11/744,357, filed on May 4, 2007, now Pat. No. 7,945,838.

(60) Provisional application No. 61/201,057, filed on Dec. 5, 2008.

(51) Int. Cl.
*G06F 11/00*       (2006.01)

(52) U.S. Cl. .................. 714/801; 714/752; 714/758

(58) Field of Classification Search ............... 714/752, 714/758, 801
See application file for complete search history.

(56) References Cited

U.S. PATENT DOCUMENTS

| | | | |
|---|---|---|---|
| 7,139,959 B2 | 11/2006 | Hocevar | |
| 7,162,684 B2 | 1/2007 | Hocevar | |
| 7,178,080 B2 | 2/2007 | Hocevar | |
| 7,181,676 B2 | 2/2007 | Hocevar | |
| 7,827,461 B1 * | 11/2010 | Low et al. | ..... 714/752 |
| 2006/0036926 A1 | 2/2006 | Hocevar | |
| 2006/0123277 A1 | 6/2006 | Hocevar | |
| 2007/0041458 A1 | 2/2007 | Hocevar et al. | |
| 2007/0086539 A1 | 4/2007 | Hocevar | |

FOREIGN PATENT DOCUMENTS

WO     2008063626 A2     5/2008

* cited by examiner

*Primary Examiner* — Sam Rizk
(74) *Attorney, Agent, or Firm* — Steven A. Shaw; W. James Brady; Frederick J. Telecky, Jr.

(57) ABSTRACT

A layered message updating method and system for the decoding of LDPC codes with high sub-matrix degree has a scalable foldable and flexible decoder architecture to support LDPC codes with arbitrary high sub-matrix degree with very small hardware overhead and high throughput. Embodiments of the invention support LDPC codes with sub-matrix degree $W => 1$.

11 Claims, 8 Drawing Sheets

SCALABLE FOLDED DECODER ARCHITECTURE FOR LOW DENSITY PARITY CHECK CODES

CROSS-REFERENCE TO RELATED APPLICATIONS

This application is a Continuation-in-Part and claims priority under 35 U.S.C. 120 to U.S. application Ser. No. 11/744,357, filed on May 4, 2007, entitled PARITY CHECK DECODER ARCHITECTURE. This Application claims priority, under 35 U.S.C. §119(e), to Provisional Application No. 61/201,057, filed Dec. 5, 2008. This application is related to U.S. application Ser. No. 12/616,925 filed on Nov. 12, 2009. This application is related to U.S. application Ser. No. 11/463,236, filed on Aug. 8, 2006, entitled A HARDWARE-EFFICIENT LOW DENSITY PARITY CHECK CODE FOR DIGITAL COMMUNICATIONS; which is a Continuation of U.S. application Ser. No. 10/329,597, filed on Dec. 26, 2002—now U.S. Pat. No. 7,178,080. This application is related to U.S. application Ser. No. 10/806,879, filed on Mar. 23, 2004, U.S. Pat. No. 7,139,959, entitled LAYERED LOW DENSITY PARITY CHECK DECODING FOR DIGITAL COMMUNICATIONS. All said applications incorporated herein by reference.

STATEMENT REGARDING FEDERALLY SPONSORED RESEARCH OR DEVELOPMENT

Not applicable.

BACKGROUND

Embodiments of the invention are in the field of digital data communications, and is more specifically directed to Low-Density Parity-Check (LDPC) codes and a scalable decoder architecture.

A problem common to digital data communication technology is the likelihood of data corruption. Data is usually corrupted by noise occurring in the communication channel. The noise interferes with the signal carrying the data over the channel, causing errors in the data bits, or symbols. As is fundamental in the art, the signal-to-noise ratio for a communications channel is a degree of goodness of the communications carried out over that channel, as it conveys the relative strength of the signal that carries the data (as attenuated over distance and time), to the noise present on that channel. These factors relate directly to the likelihood that a data bit or symbol received over the channel will be in error relative to the data bit or symbol as transmitted. This likelihood is reflected by the error probability for the communications over the channel, commonly expressed as the Bit Error Rate (BER) ratio of errored bits to total bits transmitted. In short, the likelihood of error in data communications must be considered in developing a communications technology. Techniques for detecting and correcting errors in the communicated data must be incorporated for the communications technology to be useful.

Various techniques for detecting and correcting errors in the bits have been developed. At least some error detection and correction techniques are implemented through redundant coding of the bits. For example, parity bits may be inserted into the transmitted data stream sent over the communication channel. These parity bits do not add any additional information, but can be cross-referenced to detect and correct errors in the values of other bits. Of course, these parity bits are also prone to errors. As another example, a code may repeat the transmission; for instance, the payload is sent three times. The receiver deduces the payload by using a decoder to determine which bit in each position was received two or more times. The drawback of such a decoder is that if a bit is received erroneously two or more times, the decoder will select the erroneous bit as correct. There is tradeoff between decoder architecture complexity and bit error rate. A desire for a lower bit error rate typically results in higher complexity decoder architecture than would be the case if a higher bit error rate was permitted. An architecture, system, or method that results in a less complex decoder while maintaining a low the bit error rate is desirable.

Error detection and correction techniques are typically implemented through the use of redundant coding of the data. In general, redundant coding inserts data bits into the transmitted data stream that do not add any additional information, but that indicate whether an error is present in the received data stream. More complex codes provide the ability to deduce the true transmitted data from a received data stream, despite the presence of errors.

Many types of redundant codes that provide error correction have been developed. One type of code simply repeats the transmission, for example repeating the payload twice, so that the receiver deduces the transmitted data by applying a decoder that determines the majority vote of the three transmissions for each bit. Of course, this simple redundant approach does not necessarily correct every error, but greatly reduces the payload data rate. In this example, a predictable likelihood remains that two of three bits are in error, resulting in an erroneous majority vote despite the useful data rate having been reduced to one-third. More efficient approaches, such as Hamming codes, have been developed toward the goal of reducing the error rate while maximizing the data rate.

Another class of known redundant codes is the Low Density Parity Check code. Low-Density Parity-Check (LDPC) codes are linear block codes with sparse parity check matrices. Their asymptotic performance can be as close to one tenth dB away from the Shannon limit. Another advantage of LDPC codes is that the decoding algorithm is inherently parallel and so a wide variety of hardware implementations can be derived that exploit this feature. Because of their extraordinary performance, LDPC codes have been adopted in many recent communication standards such as DVB-S2, 10 GBase-T, 802.16 and 802.11n, etc. LDPC codes are also serious candidates for many storage applications.

Existing LDPC decoders can only handle sub-matrix degree W=1 with reasonable complexity. If W is larger than 1, then the decoding complexity dramatically increases. Thus it limited many high performance LDPC codes from being implemented in real systems. A general decoder architecture that can handle LDPC codes with higher sub-matrix degree is still missing and needs to be developed for future applications on LDPC codes. There is a need for an algorithm and scalable decoder architecture to handle W>1 case.

BRIEF DESCRIPTION OF THE SEVERAL VIEWS OF THE DRAWING

Figure 1:
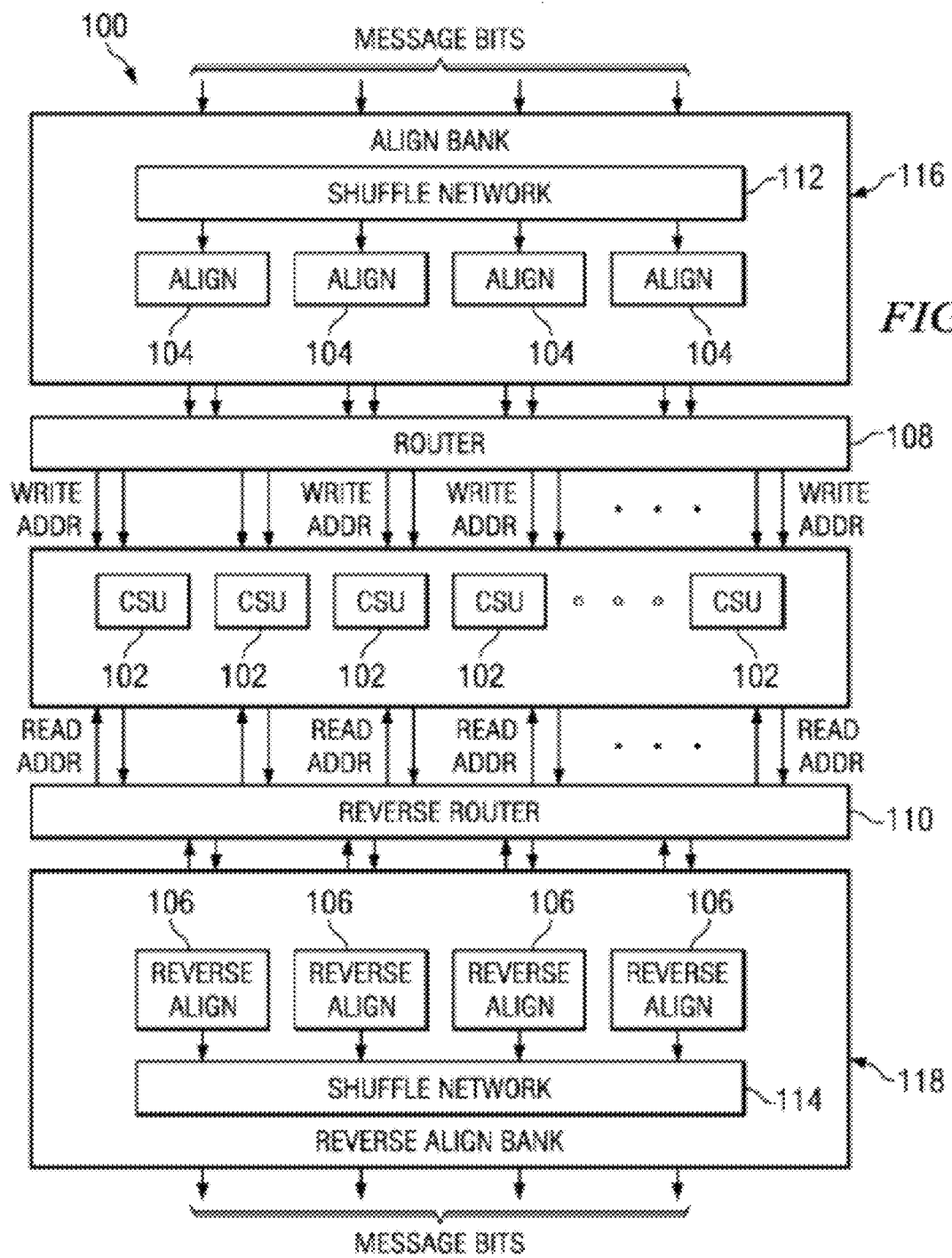

Having thus described the invention in general terms, reference will now be made to the accompanying drawings, which are not necessarily drawn to scale, and wherein:

FIG. 1 shows a partial parallel decoder architecture.

Figure 2:
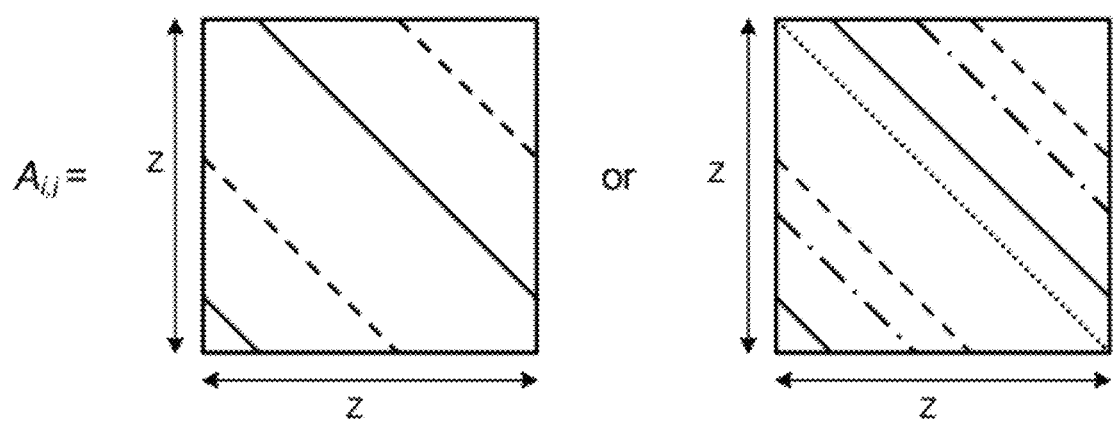

FIG. 2 shows an example of LDPC code parity check matrix.

Figure 3:
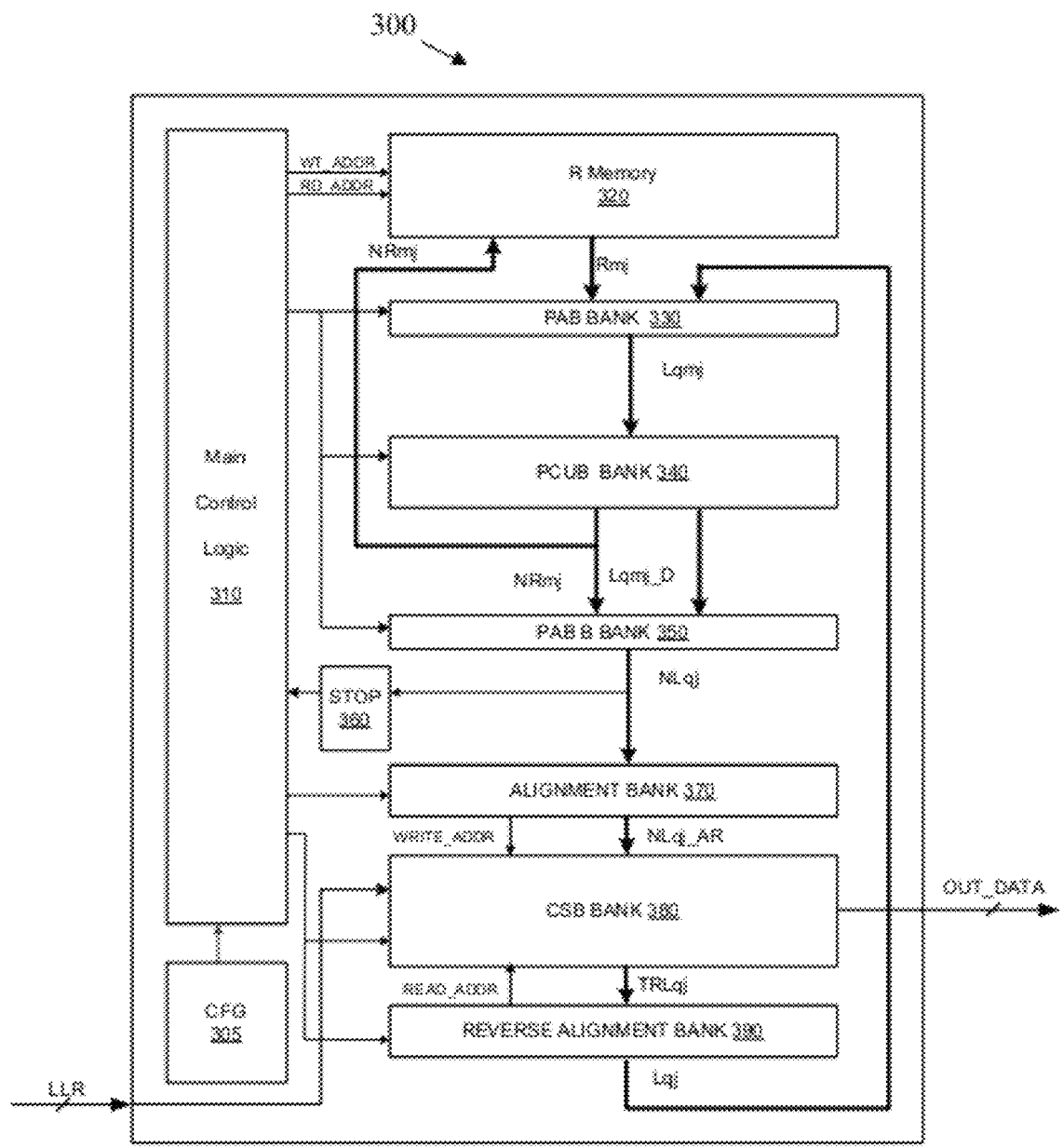

FIG. 3 shows block diagram of a LDPC decoder.

Figure 4:
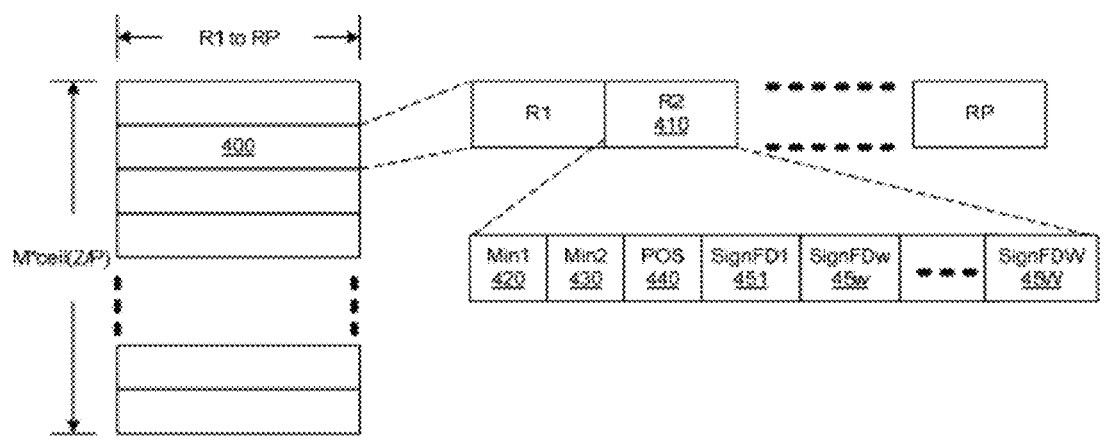

FIG. 4 shows organization of R Memory

Figure 5:
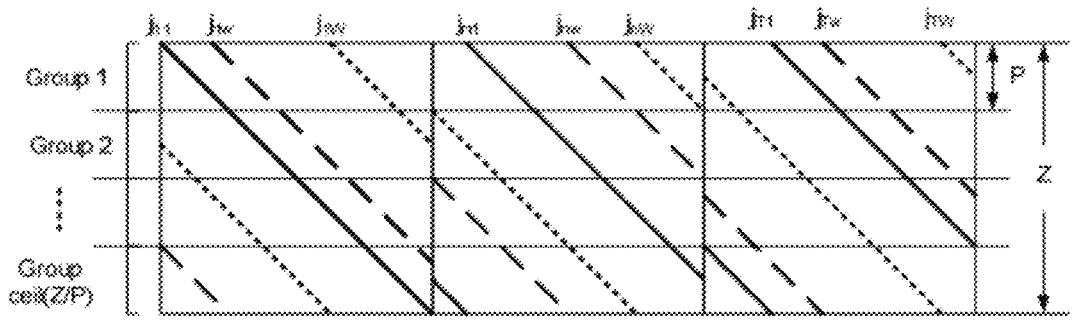

FIG. 5 shows a horizontal partition of a block row into several groups.

Figure 6:
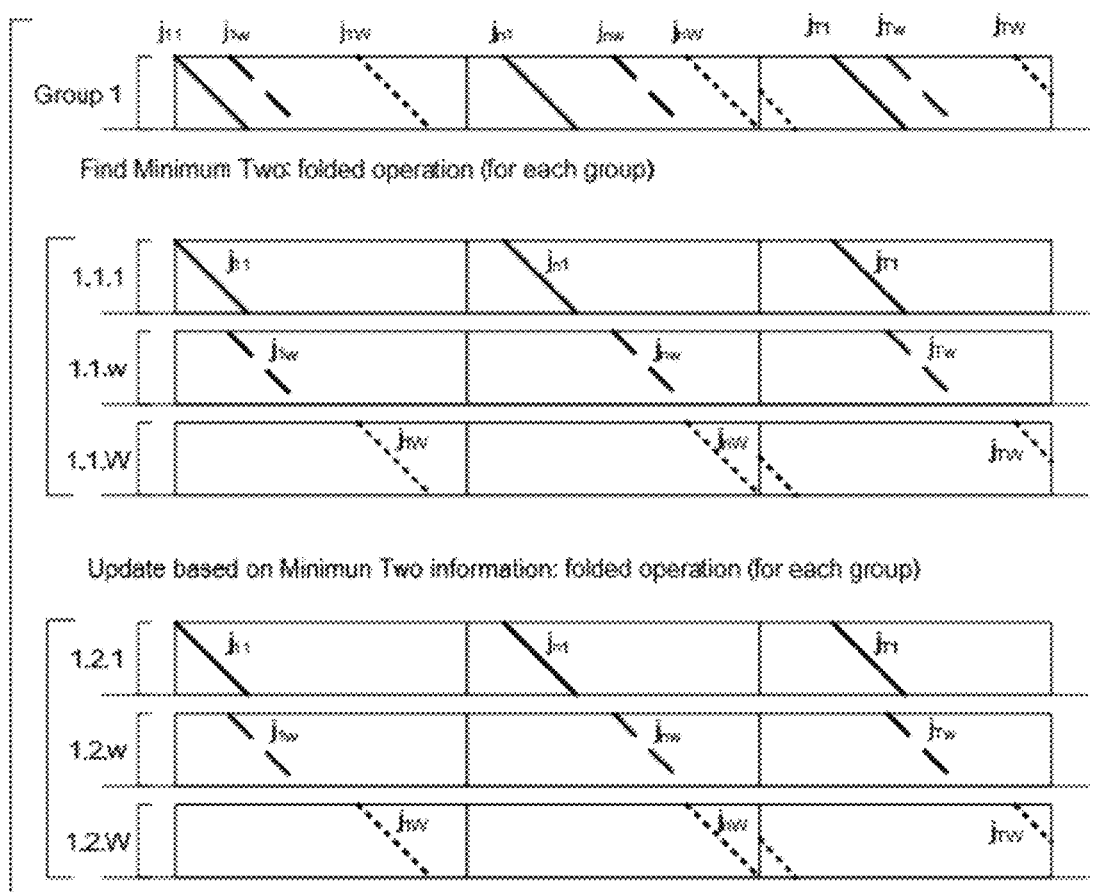

FIG. 6 shows a folded operation for parity check update.

Figure 7:
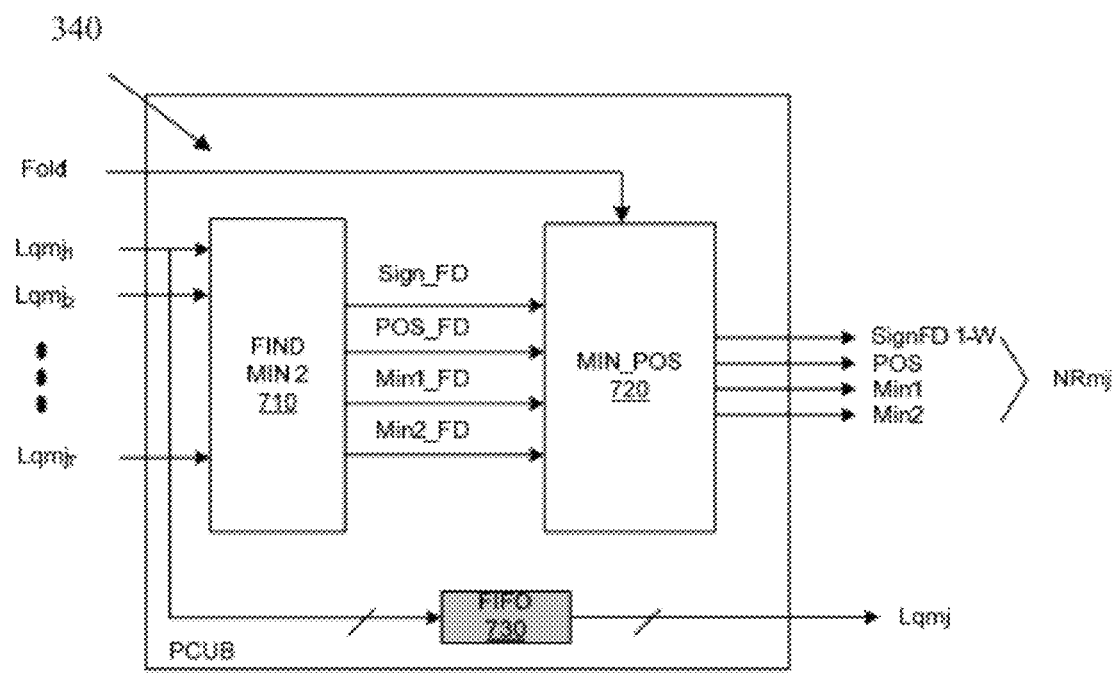

FIG. 7 shows the architecture for folded PCUB.

Figure 8:
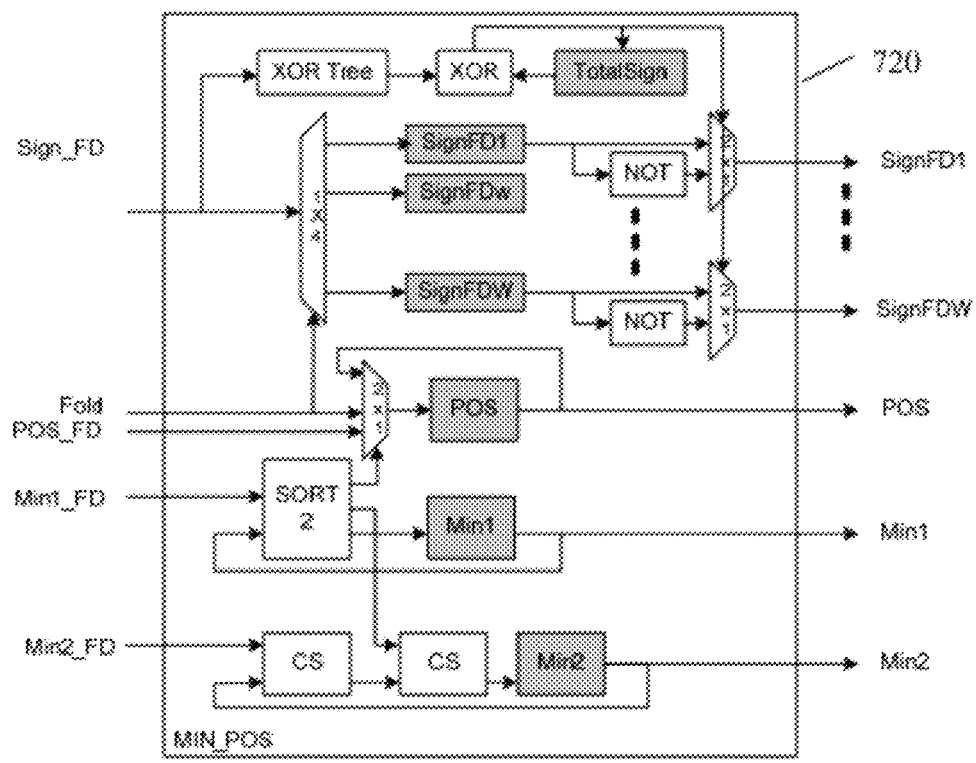

FIG. 8 shows the architecture for MIN_POS block.

Figure 9:
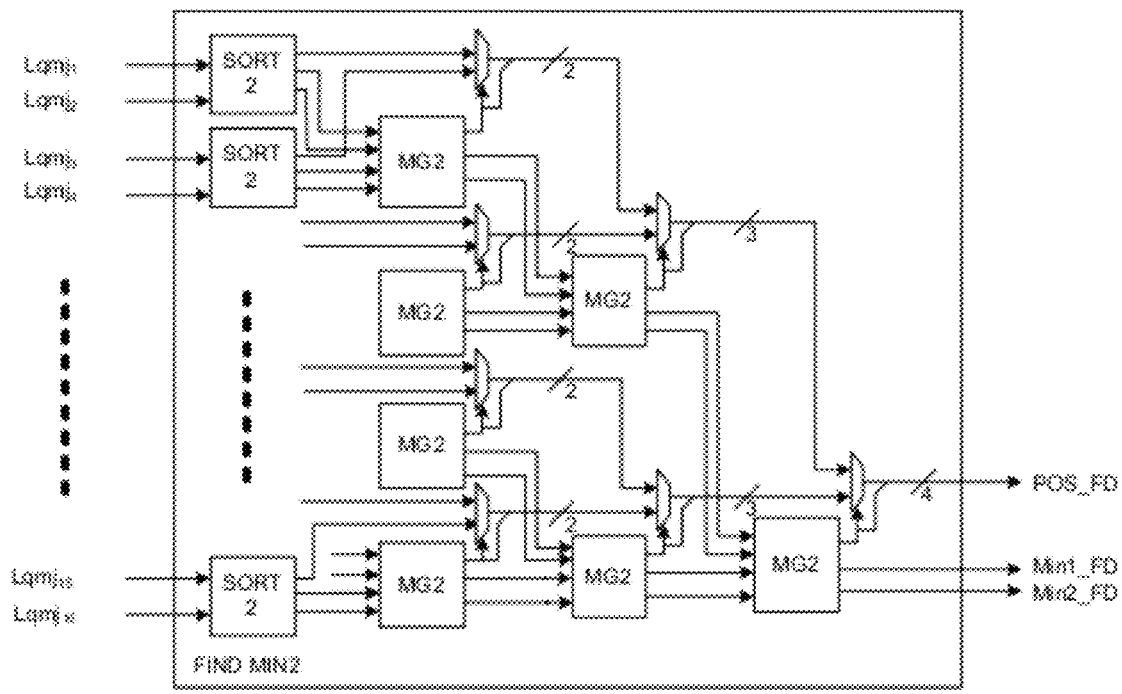

FIG. 9 shows an exemplary FIND MIN 2 block with 16 inputs.

Figure 10:
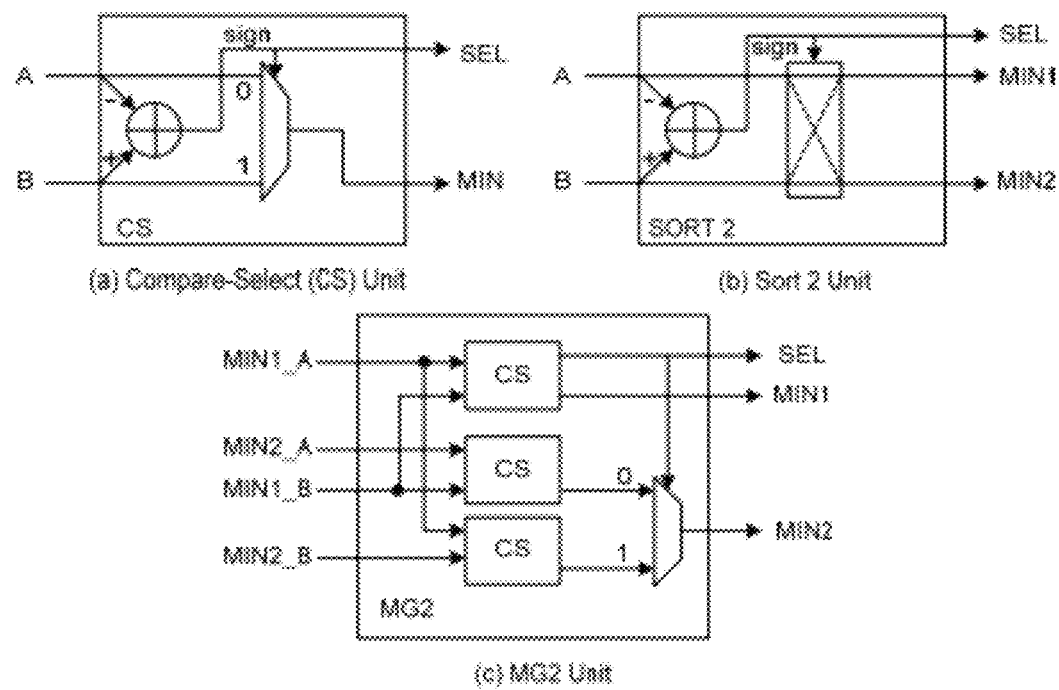

FIG. 10 comprising 10*a*, 10*b*, and 10*c* shows CS (*a*), Sort-2 (*b*) and Merge-2 Unit of FIG. 9.

DETAILED DESCRIPTION OF THE INVENTION

It should be understood at the outset that although several illustrative embodiments are described below, the present disclosure may be implemented using any number of techniques whether currently known or later developed. The present disclosure should in no way be limited to the illustrative embodiments described and illustrated herein, and may be modified within the scope of the appended claims along with their full scope of equivalents.

Certain terms are used throughout the following claims and discussion to refer to particular system components. This document does not intend to distinguish between components that differ in name but not function. In the following discussion and in the claims, the terms "including" and "comprising" are used in an open-ended fashion, and thus should be interpreted to mean "including but not limited to". Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more hardware components, and may be used to refer to an electronic device or circuit, or a portion of an electronic device or circuit.

Embodiments of the invention will be described in connection with an example of its implementation in an exemplary transceiver, for example a wireless network adapter such as according to the NASA GSFC standard. It will be apparent to those skilled in the art having reference to this specification that this invention is particularly well-suited for use in such an application. However, it is also contemplated that this invention will be of similar benefit in many other applications that involve error correction coding, including communications according to orthogonal frequency division multiplexing (OFDM), discrete multitone modulation (DMT) for example as used in conventional Digital Subscriber Line (DSL) modems, and other modulation and communication approaches, whether carried out as land line or wireless communications. It is therefore to be understood that these and other alternatives to and variations on the embodiment described below are contemplated to be within the scope of the invention as claimed.

A low-density parity-check ("LDPC") code is a type of redundant code that enables accurate detection and correction of the bits of signals sent over a communication channel. The "parity-check" adjectives refer to verifying the transmission using a matrix H, which defines the code, in conjunction with the parity bits to detect and correct errors. The "low-density" adjectives refer to the sparsity of H. Any sparse matrix, including H, has zero for the value of the majority of its elements.

The matrix H is designed such that a zero matrix results when H is multiplied by t, as described by the equation:

$$Ht=0,$$

wherein t is a non-erroneous, or valid, set of bits. Hence, whenever $Ht \neq 0$, it is known that t contains erroneous bits. Each set t consists of the source message, s, combined with the corresponding parity-check bits for that particular s. When a set t is transmitted, the receiving network element receives a vector r, which is equal to t plus n, as described by the equation:

$$r=t+n,$$

wherein n is the noise added by the channel. Because an LDPC decoder at the receiver designed to recognize the coding scheme, and hence matrix H, it can compute a vector z=Hr. Because r=t+n, and because Ht=0, the vector z is computed using the equation $$z=Hr=Ht+Hn=Hn.$$

The decoding process thus involves finding the sparsest vector x that satisfies the equation:

$$Hx=z.$$

The vector x becomes the best guess or predictor for noise vector n, which can be subtracted from the received signal vector r to recover set t, thus detecting and correcting errors in the transmitted signal t.

The decoding process involves the iterative manipulation of the signal vector expressed as fractional values in several bits. In at least some preferred embodiments, parity check matrix H is arranged into a composite of circularly shifted identity matrices. This composite is represented by a macro matrix $H_m$, with a 1 value symbolizing a $Z \times Z$ circularly shifted identity matrix and a 0 value symbolize a $Z \times Z$ zero matrix.

FIG. 1 illustrates data flow in part of an LDPC decoder, which implements the computations above. Specifically, FIG. 1 illustrates an interconnection system 100 that passes data messages in a decoder. Messages are passed in the form of wide words, i.e., a string of more than 8 bits. As such, and due to the decoding process described above, the data messages must be manipulated into correct form, i.e., from storage order to processing order, as represented by the circularly shifted identity matrices. Such manipulation is performed by an alignment bank 116 and a reverse alignment bank 118. Alignment units 104 and reverse alignment units 106 manipulate the data messages and output P values at a time, wherein P is the number of parity check rows being processed in parallel. The choice of P value is dependent on multiple system requirement such as operational clock frequency, required data rate, etc. Alignment units 104 and reverse alignment units 106 are not maintained in a one-to-one ratio with column store units ("CSUs") 102. The alignment units 104 and reverse alignment units 106 are disassociated from the CSUs 102 are independently placed within the alignment bank 116 and reverse alignment bank 118 respectively as depicted in FIG. 1. In at least some preferred embodiments, the number of alignment units 104 is equal to the number of reverse alignment units 106. The alignment units 104 are coupled to a shuffle network 112, also in the alignment bank 116. The alignment bank 116 is coupled to a router 108, which includes address generation logic (not shown) to ensure delivery to the CSUs 102. The CSUs 102 are coupled to a reverse router 110, which performs the reciprocal function of the router 108. The reverse alignment bank 118 comprises the reverse alignment units 106 coupled to another shuffle network 114.

In at least some preferred embodiments, the number of alignment units 104 is equal to the maximum row weight in macro matrix $H_m$, which is equal to the maximum row weight of parity-check matrix H, used by the decoder. The maximum row weight of $H_m$ (as well as H) is the number of non-zero elements appearing in the row with the maximum number of non-zero elements. Because the number of CSUs 102 is equal to the number of columns in $H_m$, the maximum row weight is preferably less than the number of CSUs 102. In various embodiments, the number of CSUs is less than the number of columns in $H_m$.

In other preferred embodiments, the number of alignment units 104 is not equal to the number of reverse alignment units 106, but both numbers are less than the number of column store units 102. In yet other preferred embodiments, the number of alignment units 104 and the number of reverse alignment units 106 are greater than the maximum row weight, but less than the number of column store units 102.

For well-defined, low-density parity-check codes, there is a large discrepancy between the maximum row weight of $H_m$ and number of columns in $H_m$. Exploiting this characteristic by implementing the described embodiments allows for reduction of logic complexity due to a reduction in both the number of alignment units 104 and reverse alignment units 106. A reduction of this type is significant because for macro matrices with a large number of columns, and hence a large number of CSUs 102, the duplication of alignment units 104 and reverse alignment units 106 in order to maintain a one-to-one ratio with the CSUs 102 constitutes a large source of redundancy in the decoder. Depending upon how many units are excised, the described embodiments can eliminate hundreds of thousands to millions of logic gates as compared to designs that maintain a one-to-one ratio. For instance, applying the described architecture to the WiMax (802.16e) context, the number of alignment/reverse alignment pairs can be reduced, saving about 120,000 logic gates. The broad nature of this efficiency boosting implementation allows the architecture to be applied to a decoder used for a variety of code rates and sizes. A code rate is a ratio of non-redundant bits and total bits per message, e.g., 1/3. A code size is the number of columns in the matrix H and can vary over a large range depending on the complexity of the encoding and number of bits in the message.

LDPC codes used in practical systems are composite of sub-matrices each of which being superimpose of one or more (W) permuted identity matrices of dimension Z×Z. W is referred as the degree of the sub-matrix. For example, FIG. 2 shows an example of LDPC code with M block rows and N block columns where the dimension of each sub-matrix is Z. Among the N sub-matrixes in a block row, the maximum number of non-zero sub-matrixes is T, where T is no greater than N. Each non-zero sub-matrix has a degree of W=2 or 4. The permutation of the identity matrix shown here is a simple circularly shift of identity matrix, but the actual permutation could be arbitrary.

In Texas Instruments' issued U.S. Pat. No. 7,178,080: Hardware-efficient low density parity check code for digital communications, and U.S. application Ser. No. 11/744,357 (published as US2007/0283215) Parity Check Decoder Architecture, a horizontally layered decoder architecture was presented for sub-matrix degree W=1 case.

In this application, a method to extend the decoder architecture to handle W=>1 case is disclosed. A block diagram of the decoder is shown in FIG. 3.

Decoder Architecture

PHY design can be split into several modules—top level controller, downlink receiver and uplink transmitter. FIG. 3 shows a decoder in accordance with an embodiment of the invention. The decoder 300 comprising configuration storage (CFG) unit 305 and main control block 310. The main control block 310 may containing processing circuitry such as micro processor, Digital Signal Processor or the like. The main control block may also contain firmware and storage to store machine readable media which may be read by the processing circuitry to execute instructions to perform processes in accordance with embodiments of the invention.

Decoder 300 also comprising column sum block unit (CSB) bank 380. The CSB bank 380 may containNindividual CSB units. Each CSB units may contain memories which store the updated soft information about each codeword bit. The soft information is in form of Log-Likelihood-Ratio (LLR). The CSB bank contains controller which handle the read and write control of the LLR during the input, decoding and output process. During the decoding process, the write address from alignment bank 370 and read address from reverse alignment bank 390 is input into CSB bank 380.

Decoder 300 also comprising R memory 320, which is preferably a local random access memory (RAM) for storing the $R_{mj}$ estimates. These $R_{mj}$ estimates are the most recent estimates generated by P parity check update blocks (PCUBs) of PCUB bank 340. Decoder 300 further comprises parallel adder PAB bank 330 having P modules and a second parallel adder bank PAB B bank 350 having P modules. As described above the data messages must be manipulated into correct form, i.e., from storage order to processing order, as represented by the circularly shifted identity matrices. Such manipulation is performed by an alignment bank and a reverse alignment bank. Decoder 300 comprises alignment bank 370 and reverse alignment bank 390 each having T modules.

The main control block 310 is coupled to R memory 320 through write address and read address signals. It also controls the operation of PAB bank 330, PCUB bank 340, PAB Bank 350 alignment bank 370 CSB bank 380, and reverse alignment bank 390.

R memory 320 is shown in detail in FIG. 4. R memory 320 stores the check-to-bit information. Each memory word contains the check-to-bit information from P rows, each of which is compacted stored in scaled Min-Sum algorithm. In the compacted storage scheme using one row R2 410 as example, the information stored for each row is the minimum 420 and second minimum 430 of the $R_{mj}$ value (Min1, Min2), the position of Min1 (POS) 440 and the sign bits for each of the individual check-to-bit information (a bit array of size W·T) 451, . . . 45w . . . 45W. To reduce the requirement for storage, the POS does not need to be the absolute position of the Min1 in the codeword. The index number in the W·T non-zero positions is stored instead.

Because R memory requires read and write operation performed at the same time in the worst case, the R memory should use two-port memory for preferred implementation.

The reason why the alignment 370 and reverse-alignment blocks 390 exist is that the column sum block stores the LLR data in column order while in the decoding process they are picked up in row order based on the circularly shift values. These shift values vary from block to block. So we need a general hardware to perform this pseudo-random reordering of the LLR data.

Basically, three operations are involved in the alignment and reverse-alignment, namely, left shift, right shift and segmented selection mux. Left shift and right shift move the data within one big word, and segmented selection mux select either higher part or lower part from the two input words and assemble a new word.

In STOP 360, the updated LLR values $NL(q_j)$ and current iteration number are used by decoder termination detection logic. The decoder stops decoding once it reaches maximum number of iterations or meets early termination criteria. In at least some embodiments, the detection logic keeps track of the number of rows meeting the parity check equation. Once the total number of rows which passed parity check exceeds a preset threshold, the decoding is early terminated.

Iterative Decoding Algorithm

A. Initialization:

$L(q_j)$ is initialized as the LLR based on the received soft data inputed into CSB bank 380

$$L(q_j) = \log\left(\frac{\text{Prob}(q_j = 0)}{\text{Prob}(q_j = 1)}\right).$$

For BPSK modulation over AWGN channel, the LLR is $L(q_j)=-2r_j/\sigma^2$, the check-to-bit information is initialized as $R_{mj}=0$, B. Iterative Update FIG. 5 shows one layer (block-row) of the matrix H in FIG. 2. The iteration is performed in block row order. For each row m in a block row M, the positions of '1' in the H matrix are $N(m)=[j_{11}, j_{1w}, \ldots, j_{1W}, \ldots, J_{T1}, j_{Tw}, j_{TW}]$, where $j_{nw}$ corresponds to the position in the w-th permutation of the n-th sub-matrix. FIG. 5 shows the generic case where there may be w positions wherein w can be from 1 to W.

The iterative update process of each row m involves three operations: bit node processing (performed in PAB Bank) 330 of FIG. 3, check node processing (performed in PCUB Bank) 340 of FIG. 3, and bit update (performed in PAB_B Bank) 350 of FIG. 3. The architecture is shown in FIG. 3 and described below.

Before each iteration, the LLR information $L(q_j)$ is read out from the memory in CSB Bank 380. After reverse alignment operation in Reverse alignment Bank 390, the $L(q_j)$ values are sent to PAB Bank 330. The check-to-bit information $R_{mj}$ is generated from R-Memory 320 output (Min1$_m$, Min2$_m$, Pos$_m$, and sign bits $S_{mj}$ for each j):

$$R_{mj} = \begin{cases} S_{mj} \cdot \text{Min1}_m, & \text{if } j \neq Pos_m \\ S_{mj} \cdot \text{Min2}_m, & \text{if } j = Pos_m \end{cases} \quad (1)$$

Bit Node Processing:

For each $j \in N(m)$, the bit-to-check information from bit j to check m is $$L(q_{mj})=L(q_j)-R_{mj} \quad (2)$$

Check Node Processing:

$$TotalSign_m = \prod_{n \in N(m)} \text{sign}(L(q_{mn})) \quad (3)$$

$$\text{Min1}_m = \text{First\_Min}\{|L(q_{mn})|_{n \in N(m)}\} \quad (4)$$

$$\text{Min2}_m = \text{Second\_Min}\{|L(q_{mn})|_{n \in N(m)}\} \quad (5)$$

$$Pos_m = \text{Position}(\text{Min1}_m) \quad (6)$$

$$S_{mj} = TotalSign_m \cdot \text{sign}(L(q_{mj})) \quad (7)$$

The Min1$_m$, Min2$_m$, Pos$_m$ and all sign bits for each $j \in N(m)$ is stored in R-Memory. $NR_{mj}$ is used to represent the updated check-to-bit information generated in the current iteration, thus differentiate from the $R_{mj}$ values obtained from previous iteration. The $NR_{mj}$ value from check m can be generated as the following.

$$A_{mj} = \begin{cases} \text{Min1}, & \text{if } j \neq Pos_m \\ \text{Min2}, & \text{if } j = Pos_m \end{cases} \quad (8)$$

$$NR_{mj} = S_{mj} \cdot (A_{mj} \cdot f_s + f_o) \quad (9)$$

Here the $f_s$, and $f_o$ are optional multiplicative and additive factor for scaled Min-Sum or shifted Min-Sum implementation.

Bit Update:

$$NL(q_j)=L(q_{mj})+NR_{mj} \quad (10)$$

Here $NL(q_j)$ used to represent the updated information about codeword bit j thus differentiate from the $L(q_j)$ values obtained from previous iteration. The $NL(q_j)$ values updated by folded bit update operation are written back to CSB bank 380 after alignment operation in Alignment bank 370.

C. Output

After the final iteration, the soft information $L(q_j)$ or the hard decision of $L(q_j)$ is output from CSB bank 380.

Decoding Algorithm with Folded Operation

For sub-matrix with degree W>1, the folded operation described in this section may be used to perform the update. The operation is depicted in FIG. 6.

To simplify the description, we assume each non-zero sub-matrix has degree W here. For each row in a group, there are W·T positions of '1' in H matrix which is represented by a set $N(m)=[j_{11}, j_{1w}, \ldots, j_{1W}, \ldots, j_{T1}, j_{Tw}, j_{TW}]$. Each $j_{nw}$ in $N(m)$ corresponds to the '1' generated by the w-th circularly shifted identity within the n-th sub-matrix. The set $N(m)$ is divided into W folds With each fold w contains T positions $N_w(m)= [j_{1w}, j_{2w}, \ldots, j_{Tw}]$.

Similar to the W=1 case, the iterative update process contains three operations: bit node processing, check node processing and bit update. For W>1 case, the bit node processing and check node processing is first performed for all the W folds, after the new check-to-bit information $NR_{mj}$ is generated, the bit update is performed to all W folds. The fold operation requires temporary registers to store Min1, Min2, Pos, all sign bits vector $SignFD_1, \ldots, SignFD_W$ and the XOR result of all sign bits TotalSign.

Before the folded bit node processing and check node processing is performed, the temporary registers Min1, Min2, TotalSign are initialized. Min1 and Min2 are initialized to maximum positive number, TotalSign is initialized to 0.

Folded Bit Node Processing:

For each $j \in N_w(m)$, the bit-to-check information from bit j to check m is $$L(q_{mj})=L(q_j)-R_{mj} \quad (11)$$

Folded Check Node Processing:

$$\text{Min1} = \text{First\_Min}\{\text{Min1, Min2}, |L(q_{mn})|_{n \in N_w(m)}\} \quad (12)$$

$$\text{Min2} = \text{Second\_Min}\{\text{Min1, Min2}, |L(q_{mn})|_{n \in N_w(m)}\} \quad (13)$$

$$\text{Pos} = \text{Position}(\text{Min1}) \quad (14)$$

$$TotalSign = \prod_{n \in N_w(m)} \text{sign}(L(q_{mn})) \cdot TotalSign \quad (15)$$

The Min1, Min2, Pos, TotalSign and SignFD$_w$, which is all sign bits of L(q$_{mj}$) for each j∈N$_w$(m), are stored in the registers. After the W folds are all processed, the new check-to-bit information NR$_{mj}$ is generated as $$Min1_m = Min1 \cdot f_s + f_o \quad (16)$$

$$Min2_m = Min2 \cdot f_s + f_o \quad (17)$$

$$Pos_m = Pos \quad (18)$$

$$SignFD_{wm} = TotalSign \cdot SignFD_w \quad (19)$$

The Min1$_m$, Min2$_m$, Pos$_m$ and SignFD$_{1m}$, SignFD$_{wm}$, SignFD$_{Wm}$ are stored in R-Memory. Here the f$_s$, and f$_o$ are optional multiplicative and additive factor for scaled Min-Sum or shifted Min-Sum implementation.

Folded Bit Update:

For each fold w in 1 to W, the NR$_{mj}$ values are generated from the Min1$_m$, Min2$_m$, Pos$_m$ and SignFD$_{1m}$, SignFD$_{wm}$, SignFD$_{Wm}$ values. For each j∈N$_w$(m), the sign bits S$_{mj}$ are obtained from SignFD$_{wm}$ and the amplitude is obtained from $$A_{mj} = \begin{cases} Min1, & \text{if } j \neq Pos_m \\ Min2, & \text{if } j = Pos_m \end{cases} \quad (20)$$

$$NR_{mj} = S_{mj} \cdot A_{mj} \quad (21)$$

$$NL(q_j) = L(q_{mj}) + NR_{mj} \quad (22)$$

With this fold operation, the number of major blocks such as alignment and reverse-alignment modules in Alignment Bank 370 and Reverse Alignment Bank 390 respectively do not need to grow with the degree W. The critical path in PCUB Bank 340 is determined by T and does not increase with degree W. Thus, the fold operation greatly reducing the complexity of the decoder.

The folded operation described here is applicable to the case where the non-zero sub-matrixes have different degree no greater than W. Slight modification in controller is needed to mask out the non-exist folds. For example, if a sub-matrix has degree W'<W, then for each row m the mask operation is needed for positions j$_{mw}$, w=[W'+1, ..., W]. One preferred way of masking out the non-exist positions is to substitute their corresponding L(q$_{mj}$) values with maximum positive number in folded check node operation and disable the write back of the NL(q$_j$) values after bit update operation.

FIG. 7 is a PCUB unit 340 of FIG. 3 in accordance with embodiments of the invention. PCUB unit comprises FIND MIN 2 block 710, MIN_POS block 720 coupled to FIND MIN2 710, and as FIFO 730. The FIND MIN 2 block 710 find the two minimum values (Min1_FD, Min2_FD) of the T inputs within one fold. The Position of the Min1_FD (Pos_FD) and the sign bits are also generated. The MIN_POS 720 is used to combine the results of all fold and generated NR$_{mj}$. FIFO 730 are temporary storage for synchronizing the L(q$_{mj}$) and NR$_{mj}$ values for folded bit update operation.

FIG. 8 is a block diagram illustrative of a MIN_POS unit 720 of FIG. 7 in accordance with embodiments of the invention. MIN_POS unit 720 is used to update the Min1, Min2, and POS values from fold to fold. The shaded blocks represent registers which is initialized before processing one block row.

FIG. 9 is a block diagram illustrative of a preferred implementation of the FIND MIN 2 unit 710 of FIG. 7 with 16 inputs. FIG. 10 comprising 10(a), 10(b), and 10(c) shows CS (a), Sort-2 (b) and Merge-2 Unit (MG2) of FIG. 9.

In FIGS. 9 and 10, Sort-2 unit FIG. 10(b) output the two inputs in order and the position of the minimum number. MG2 unit FIG. 10(c) merges two sorted input pair and outputs the minimum and second minimum of the four inputs. It also outputs the pair index of the minimum number. The compare-select (CS) unit in MG2 unit takes two input and output the minimum number among the two inputs. It output the position of the minimum as well. The block diagram of CS unit is also shown in FIG. 10(a).

While the invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein. Other items shown or discussed as directly coupled or communicating with each other may be coupled through some interface or device, such that the items may no longer be considered directly coupled to each other but may still be indirectly coupled and in communication, whether electrically, mechanically, or otherwise with one another. Other examples of changes, substitutions, and alterations will become apparent to those skilled in the art. It is intended that the following claims be interpreted to embrace all such changes, substitutions, and alterations.

What is claimed is:

1. A parity-check decoder comprising:
a plurality of column store units;
one or more alignment units coupled to the plurality of column store units;
a parity check update block for folded check node processing;
a first parallel adder bank for folded bit node processing; and
a second parallel adder bank for folded bit updating.

2. The parity-check decoder of claim 1, wherein said parity check update block operable to perform a fold operation, said parity check update block further comprising:
a find min 2 unit for finding minimum two of n inputs; and
a MIN_POS block for updating a position of minimum based on finding minimum two for each fold.

3. A system comprising:
a receiver;
a plurality of column store units;
one or more alignment units coupled to the plurality of column store units;
a parity-check decoder coupled to the receiver;
a parity check update block for check node processing;
a first parallel adder bank for bit node processing; and
a second parallel adder bank for bit updating.

4. The system of claim 3, wherein said parity check update block operable to perform a fold operation, said parity check update block further comprising:
a find min 2 unit for finding minimum two of n inputs; and
a MIN_POS unit for updating a position of minimum based on finding minimum two for each fold.

5. A method of parity checking implemented in a system including a hardware parity-check decoder of a transceiver, said method comprising:
aligning data to produce wide words using aligning units;
performing fold operation comprising:

finding minimum two; and
updating based on finding minimum two.

6. The method of claim 5, further comprising:
folded bit node processing:
folded check node processing; and
folded bit updating.

7. The method of claim 6, further comprising:
folded bit node processing is perform according to:

$L(q_{mj})=L(q_j)-R_{mj};$ folded check node processing is perform according to:

$\text{Min1} = \text{First\_Min}\{\text{Min1}, \text{Min2}, |L(q_{mn})|_{n \in N_v(m)}\};$ $\text{Min2} = \text{Second\_Min}\{\text{Min1}, \text{Min2}, |L(q_{mn})|_{n \in N_v(m)}\};$ $\text{Pos} = \text{Position}(\text{Min1});$ $\text{TotalSign} = \prod_{n \in N_v(m)} \text{sign}(L(q_{mn})) \cdot \text{TotalSign};$ storing Min1, Min2, Pos, TotalSign and SignFDw in a plurality of registers;
generating a new check-to-bit information ($NR_{mj}$) after W folds are all processed according to:

$\text{Min1}_m = \text{Min1} \cdot f_s + f_o;$ $\text{Min2}_m = \text{Min2} \cdot f_s + f_o;$ $\text{Pos}_m = \text{Pos};$ $\text{Sign}FD_{wm} = \text{TotalSign} \cdot \text{Sign}FD_w;$ wherein the $f_s$ and $f_o$ are multiplicative and additive factors;
storing $\text{Min1}_m$, $\text{Min2}_m$, $\text{Pos}_m$ and $\text{SignFD}_{1m}$, $\text{SignFD}_{wm}, \ldots, \text{SignFD}_{Wm}$ in a memory;
generating, for each fold w in 1 to W, the $NR_{mj}$ values from the $\text{Min1}_m$, $\text{Min2}_m$, $\text{Pos}_m$ and $\text{SignFD}_{1m}$, $\text{SignFD}_{wm}$, $\text{SignFD}_{Wm}$ values; wherein for each $j \in N_v(m)$, the sign bits $S_{mj}$ are obtained from $\text{SignFD}_{wm}$ and the amplitude is obtained from $A_{mj} = \begin{cases} \text{Min1}, & \text{if } j \neq Pos_m \\ \text{Min2}, & \text{if } j = Pos_m; \end{cases}$ $NR_{mj} = S_{mj} \cdot A_{mj};$ bit updating is perform according to:

$NL(q_j) = L(q_{mj}) + NR_{mj}.$

8. The method of claim 6, further comprising:
masking out non-exist folds.

9. The method of claim 8, wherein if a sub-matrix has degree W'<W, then for each row m the mask operation is needed for positions $j_{mw}$, w=[W'+1, ..., W] then masking out non-exist folds comprising:
substituting the $L(q_{mj})$ values of the non-exist positions with a maximum positive number during the folded check node operation; and disabling the write back of the $NL(g_j)$ values after the folded bit update operation.

10. The method of claim 5, further comprising:
masking out non-exist folds.

11. The method of claim 10, wherein if a sub-matrix has degree W'<W, then for each row m the mask operation is needed for positions $j_{mw}$, w=[W'+1, ..., W] then masking out non-exist folds comprising:
substituting the $L(q_{mj})$ values of the non-exist positions with a maximum positive number during the folded check node operation; and disabling the write back of the $NL(g_j)$ values after the folded bit update operation.

* * * * *